United States Patent
Furuichi

(10) Patent No.: US 7,956,286 B2
(45) Date of Patent: Jun. 7, 2011

(54) CABLE HANDLING STRUCTURE FOR LINEAR AXIS, AND SUBSTRATE TRANSFER DEVICE EQUIPPED WITH THE SAME

(75) Inventor: Masatoshi Furuichi, Fukuoka (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 208 days.

(21) Appl. No.: 12/399,634

(22) Filed: Mar. 6, 2009

(65) Prior Publication Data
US 2009/0223697 A1 Sep. 10, 2009

(30) Foreign Application Priority Data
Mar. 6, 2008 (JP) .................... 2008-055857

(51) Int. Cl.
*H01B 7/06* (2006.01)
(52) U.S. Cl. ........ 174/69; 174/72 A; 174/68.3; 248/244; 361/826; 312/294
(58) Field of Classification Search ............... 174/69, 174/72 A, 68.3; 211/26, 151; 248/282.1, 248/244; 361/826; 312/294
See application file for complete search history.

(56) References Cited

U.S. PATENT DOCUMENTS

| 5,297,910 A | 3/1994 | Yoshioka et al. |
| 6,945,504 B2 * | 9/2005 | Chen et al. ................. 248/282.1 |
| 7,306,481 B2 * | 12/2007 | Tsukamoto ................... 439/501 |
| 7,473,846 B2 * | 1/2009 | Doerr et al. ..................... 174/69 |
| 7,569,772 B2 * | 8/2009 | McClellan et al. ............. 174/69 |
| RE41,322 E * | 5/2010 | Huang et al. .................... 174/69 |

FOREIGN PATENT DOCUMENTS

| JP | 01-110014 A | 4/1989 |
| JP | 05-074699 A | 3/1993 |

* cited by examiner

*Primary Examiner* — Dhiru R Patel
(74) *Attorney, Agent, or Firm* — Westerman, Hattori, Daniels & Adrian, LLP

(57) ABSTRACT

A cable handling structure for a linear axis includes a base member, a slide member capable of linearly sliding in parallel with the base member, and a cable guide configured to guide a cable extended from the base member to the slide member with the cable accommodated in the cable guide. The cable guide is curved into a U-shape with one end thereof fixed to the base member and the other end thereof fixed to the slide member, and disposed so as to extend in a moving direction of the slide member and incline with respect to the base member as seen from the moving direction of the slide member.

10 Claims, 10 Drawing Sheets

CABLE HANDLING STRUCTURE FOR LINEAR AXIS, AND SUBSTRATE TRANSFER DEVICE EQUIPPED WITH THE SAME

This application claims priority under 35 U.S.C. §119 to Japanese Patent Application No. 2008-55857 filed on Mar. 6, 2008, the entire disclosure of which is incorporated herein by reference in its entirety.

BACKGROUND OF THE INVENTION

1. Field of the Invention

The preferred embodiments of the present invention relate, inter alia, to a cable handling structure for handling cables in a linear axis having a linearly movable member, and also relate to a substrate transfer device equipped with the cable handling structure.

2. Description of the Related Art

The following description sets forth the inventor's knowledge of related art and problems therein and should not be construed as an admission of knowledge in the prior art.

In some conventional transfer devices, a linear axis is employed for a movable portion. An example of such a transfer device equipped with a linear axis is disclosed by Japanese Unexamined Laid-open Patent Publication No. 2005-93812 (hereinafter referred to as "Document 1"). Document 1 describes that a holding arm for holding a substrate, such as, e.g., a wafer, is moved by a linear axis mechanism in a linearly slidable manner (see FIG. 8 of Document 1).

As a cable handling structure for appropriately guiding cables and/or tubes, such as, e.g., cables for supplying electric power or tubes for supplying fluid such as air or cooling water (hereinafter simply referred to as "cable(s)" in this disclosure including the specification, claims and abstract), between relatively movable two portions, a cable guide or a tube guide (hereinafter simply referred to as "cable guide" in the disclosure) is used. Such a cable guide is arranged along the linear axis with cables accommodated therein so as to guide the cables while being curved in a U-shaped manner. Such a guide has been conventionally used in various devices (see, e.g., Japanese Unexamined Laid-open Patent Publication No. H11-122790 (hereinafter referred to as "Document 2")).

FIG. 9 is a cross-sectional view of a transfer device as seen from the axial direction of the linear axis in which cables for the linear axis of the transfer device as shown in Document 1 are handled by cable guides. In FIG. 9, the transfer device has two linear axes arranged in parallel with each other.

Two linear guide mounting plates 33 and 33 are arranged in parallel with each other at a distance and fixed perpendicularly to the base table 34. Linear guides 31 are fixed to the respective vertical outer surfaces of the linear guide mounting plates 33. Slidably mounted on the linear guides 31 and 31 are linear guide movable portions 32 and 32 to which basal ends of hands 27a and 27b are fixed respectively. Each linear guide 31 is arranged so as to extend in the depth direction in FIG. 9, so that the linear guide movable portion 32 is guided linearly while sliding on the linear guide 31. Thus, the depth direction in FIG. 9 is the moving direction of the linear axis of this transfer device. Each of the two hands 27a and 27b is configured to mount a wafer 28. The hands 27a and 27b are independently driven with motors (not shown) in the depth direction in FIG. 9, respectively, to transfer the wafers 28.

In the case of making the hand 27a and 27b hold a wafer 28 or electrically detecting the existence or nonexistence of a wafer 28, it is required to supply electric power or air to the hand 27a and 27b, which in turn necessitates some structure for guiding cables for supplying electric power or air to the hand 27a and 27b. In the embodiment shown in FIG. 9, the cable guide 38 for handling the cables is arranged along the linear axis and disposed in a U-shaped manner in the axial direction of the linear axis. One end of the cable guide 38 is fixed to the table 34 with the cable guide fixed side member 39, and the other end thereof is fixed to the basal end portion of the hand 27a and 27b via the cable guide movable side support post 40. Cables (not shown) are extended from the base 34 side to each cable guide 38 and accommodated in each cable guide 38, so that electric power or fluid (e.g., air) is supplied to the hand 27a and 27b.

With this structure, in accordance with the movement of the hand 27a and 27b along the linear axis, the other end of the cable guide 38 is moved, which enables the cables accommodated in the cable guide 38 to be appropriately guided without causing any interference with other members.

In the linear axis as mentioned above, in cases where the cable guides 38 are arranged as shown in FIG. 9, if the bend radius of the U-shaped portion of each cable guide 38 is large, a large gap 42 will be required above the linear axis, which in turn increases the height size of the transfer device.

Furthermore, in the case of arranging two linear axes in parallel, a space for accommodating two cable handling structures will be required, which increases the width size of the transfer device.

For the purpose of reducing the device height, even if the cable guides 38 are arranged outside the linear axes as shown in FIG. 10, the planar size of the device increases.

In cases where a plurality of linear axes are arranged in parallel, the device size markedly increases by the aforementioned problems and that the arrangement of the cable guides becomes complicated.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatuses disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a cable handling structure for a linear axis capable of reducing a mounting space for the cable handling structure and reducing a device size even in cases where a plurality of linear axes are arranged.

Among other potential advantages, some embodiments can provide a substrate transfer device equipped with the cable handling structure for a linear axis capable of reducing a mounting space for the device and reducing a device size even in cases where a plurality of linear axes are arranged.

According to a first aspect of a preferred embodiment of the present invention, a cable handling structure for a linear axis, the cable handling structure comprising:

a base member;

a slide member capable of linearly sliding in parallel with the base member; and a cable guide arranged so as to connect the base member and the slide member and configured to guide a cable extended from the base member to the slide member with the cable accommodated in the cable guide, wherein the cable guide is curved into a U-shape with one end thereof fixed to the base member and the other end thereof fixed to the slide member, and disposed so as to extend in a moving direction of the slide member and incline with respect to the base member as seen from the moving direction of the slide member.

According to a second aspect of a preferred embodiment of the present invention, a cable handling structure for a linear axis, the cable handling structure comprising:

a base member;

a slide member capable of linearly sliding with respect to the base member; and a cable arranged so as to extend from the base member to the slide member, wherein the cable is curved into a U-shape with one end thereof fixed to the base member and the other end thereof fixed to the slide member, and disposed so as to extend in a moving direction of the slide member and incline with respect to the base member as seen from the moving direction of the slide member.

According to a third aspect of a preferred embodiment of the present invention, a substrate transfer device equipped with a cable handling structure for a linear axis, the cable handling structure comprising:

a base member;

a slide member capable of linearly sliding in parallel with the base member; and a cable guide arranged so as to connect the base member and the slide member and configured to guide a cable extended from the base member to the slide member with the cable accommodated in the cable guide, wherein the cable guide is curved into a U-shape with one end thereof fixed to the base member and the other end thereof fixed to the slide member, and disposed so as to extend in a moving direction of the slide member and incline with respect to the base member as seen from the moving direction of the slide member.

According to a fourth aspect of a preferred embodiment of the present invention, a substrate transfer device equipped with a cable handling structure for a linear axis, the cable handling structure comprising:

a base member;

a slide member capable of linearly sliding with respect to the base member; and a cable arranged so as to extend from the base member to the slide member, wherein the cable is curved into a U-shape with one end thereof fixed to the base member and the other end thereof fixed to the slide member, and disposed so as to extend in a moving direction of the slide member and incline with respect to the base member as seen from the moving direction of the slide member.

According to a fifth aspect of a preferred embodiment of the present invention, a substrate transfer device equipped with a cable handling structure for a linear axis, the substrate transfer device comprising:

a base member disposed horizontally;

first and second hands each capable of mounting a substrate, the first and second hands being capable of linearly sliding in parallel with the base member and independently moving in parallel with each other;

a first cable guide arranged so as to connect the base member and the first hand and configured to guide a first cable extended from the base member to the first slide member; and a second cable guide arranged so as to connect the base member and the second hand and configured to guide a second cable extended from the base member to the second slide member, wherein the first and second cable guides each are curved into a U-shape with one ends of the first and second cable guides fixed to the base member and the other ends of the first and second cable guides fixed to the respective first and second hands, and disposed so that the first and second cable guides extend in a moving direction of the first and second hands with inner sides of curved portions of the first and second cable guides facing each other and the curved portions cross as seen from the moving direction of the first and second hands, and wherein the first and second hands each are extended in parallel to a horizontal plane of the base member, then extended in a vertical direction, and then extended in a horizontal direction so that the first and second hands overlap up and down.

According to a sixth aspect of a preferred embodiment of the present invention, a substrate transfer system in which a plurality of substrate transfer devices each having a cable handling structure for a linear axis are stacked in a vertical direction, wherein each of the plurality of substrate transfer devices comprises:

a base member disposed horizontally;

first and second hands each capable of mounting a substrate, the first and second hands being capable of linearly sliding in parallel with the base member and independently moving in parallel with each other;

a first cable guide arranged so as to connect the base member and the first hand and configured to guide a first cable extended from the base member to the first slide member; and a second cable guide arranged so as to connect the base member and the second hand and configured to guide a second cable extended from the base member to the second slide member, wherein the first and second cable guides each are curved into a U-shape with one ends of the first and second cable guides fixed to the base member and the other ends of the first and second cable guides fixed to the respective first and second hands, and disposed so that the first and second cable guides extend in a moving direction of the first and second hands with inner sides of curved portions of the first and second cable guides facing each other and the curved portions cross as seen from the moving direction of the first and second hands, and wherein the first and second hands each are extended in parallel to a horizontal plane of the base member, then extended in a vertical direction, and then extended in a horizontal direction so that the first and second hands overlap up and down.

According to the aforementioned cable handling structure/device/system employing the cable handing structure as explained above, the widthwise and/or lengthwise size of the structure/device/system can be reduced by the inclined arrangement of the cable guide or cable itself with respect to the base member.

Even in cases where two linear axes are arranged and electric power or air is supplied to the linear axes, the widthwise and/or lengthwise size of the structure/device/system can be reduced by the crossed arrangement of the cable guides.

Furthermore, by stacking a plurality of substrate transfer devices up and down and arranging the hands as mentioned above, a substrate transfer system reduced in size can be provided.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

First Embodiment

Figure 2:
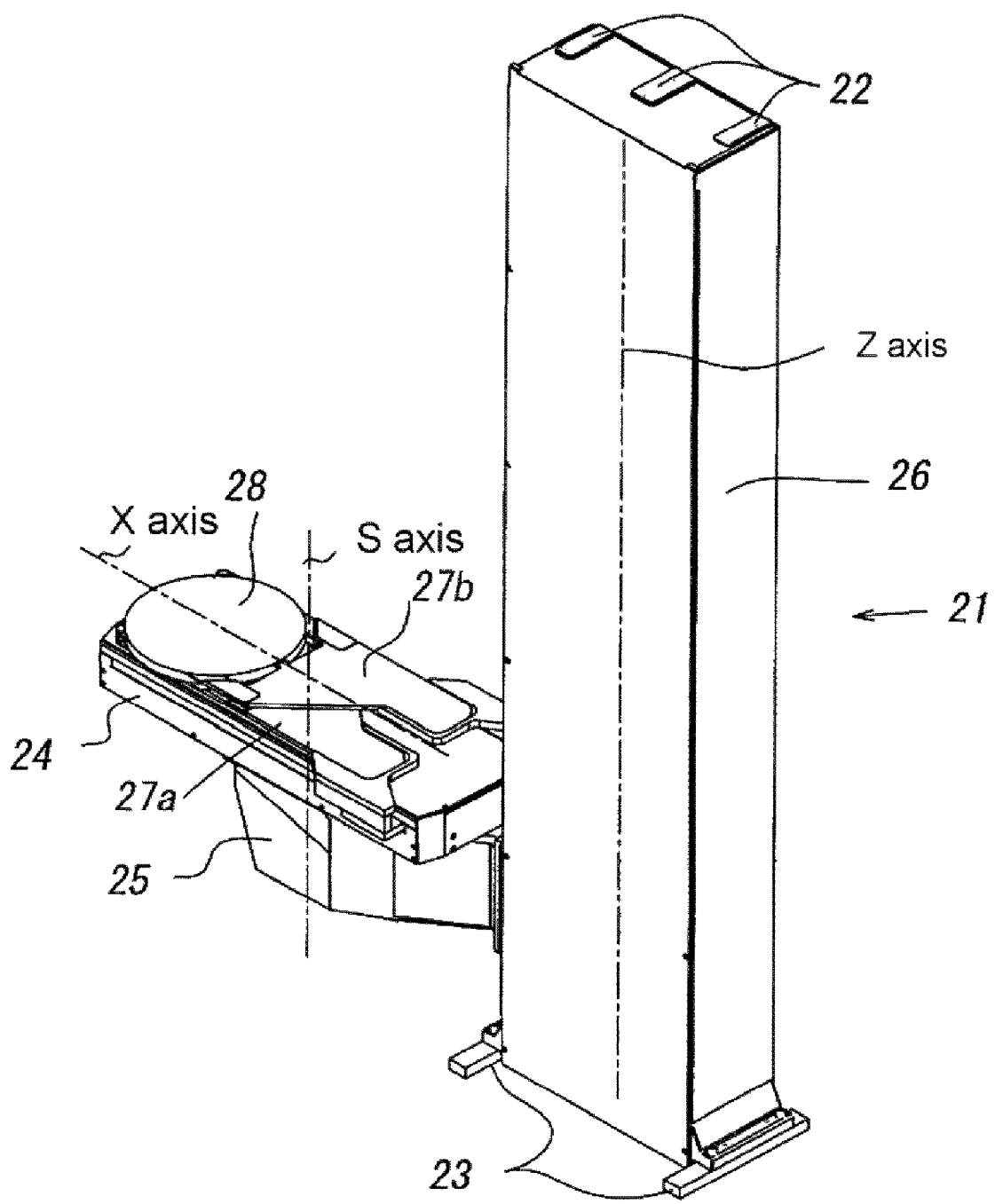
FIG. 2 is an entire perspective view of a manipulator employing the linear axis driving portion of the present invention.

Initially, a wafer transferring manipulator, which is one of the transfer devices according to the present invention, will be explained with reference to the attached drawings. FIG. 2 shows a perspective view showing an entire wafer transferring manipulator having a linear axis in which a cable handling structure is employed.

In FIG. 2, the manipulator 21 is a transfer device in which the manipulator upper mounting portions 22 of a manipulator lifting and lowering driving portion 26 and the manipulator lower mounting portions 23 thereof are fixed to a mount of a semiconductor production device (not shown). The manipulator supporting portion 25 has a degree of freedom along the Z-axis and is configured to be moved upward and downward by a motor (not shown) mounted in the manipulator lifting and lowering driving portion 26. The linear axis driving portion 24 has a degree of freedom in a rotational direction centering around the S-axis and is configured to be rotationally driven by a motor (not shown) mounted in the manipulator supporting portion 25. The first hand 27a and the second hand 27b each have a degree of freedom along the X-axis, and are configured to be independently moved forward and rearward by a motor (not shown) mounted in the linear axis driving portion 24. Furthermore, in order to prevent the first hand 27a and the second hand 27b holding wafers 28 from dropping the wafers 28 during the operation of the manipulator 21, the first hand 27a and the second hand 27b each have a structure for holding the wafer 28 and/or a structure for detecting the existence or absence of the wafer 28.

The manipulator 21 constituted as mentioned above is driven in accordance with preliminary stored data, so that the positions and angles of the first and second hands 27a and 27b are controlled.

Next, the cable handling structure in the linear axis equipped in the aforementioned manipulator 21 will be explained.

Figure 1:
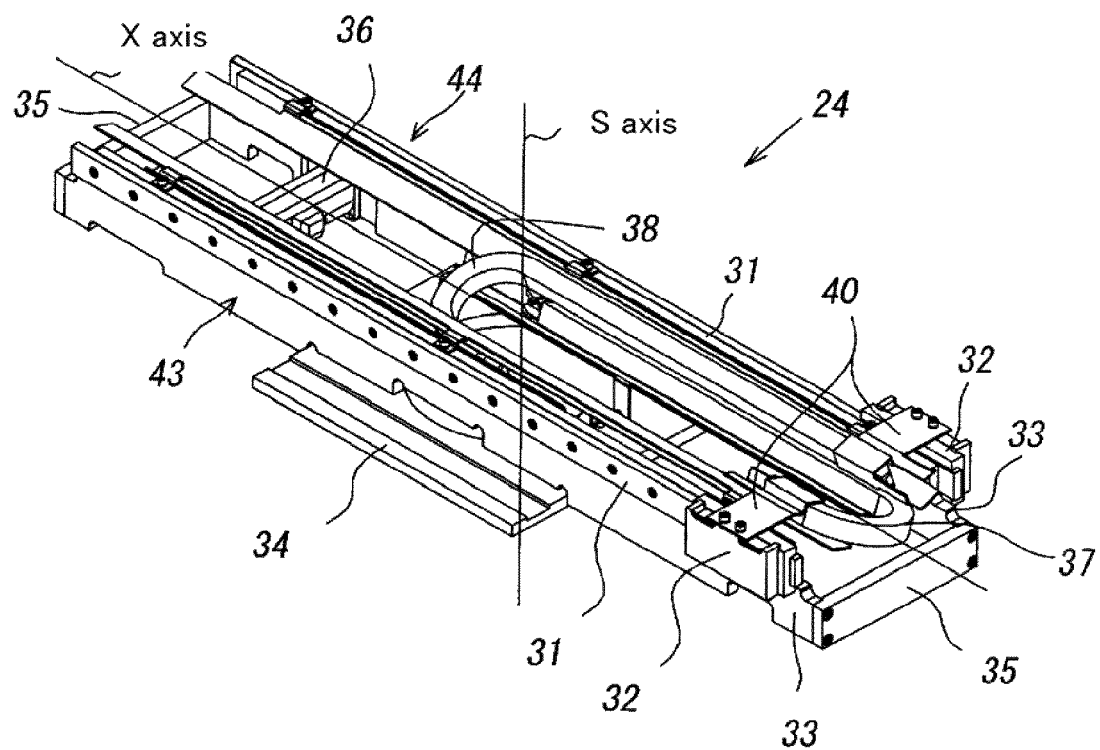
FIG. 1 is a perspective view showing an inside of a linear axis driving portion according to a first embodiment of the present invention.
Figure 3:
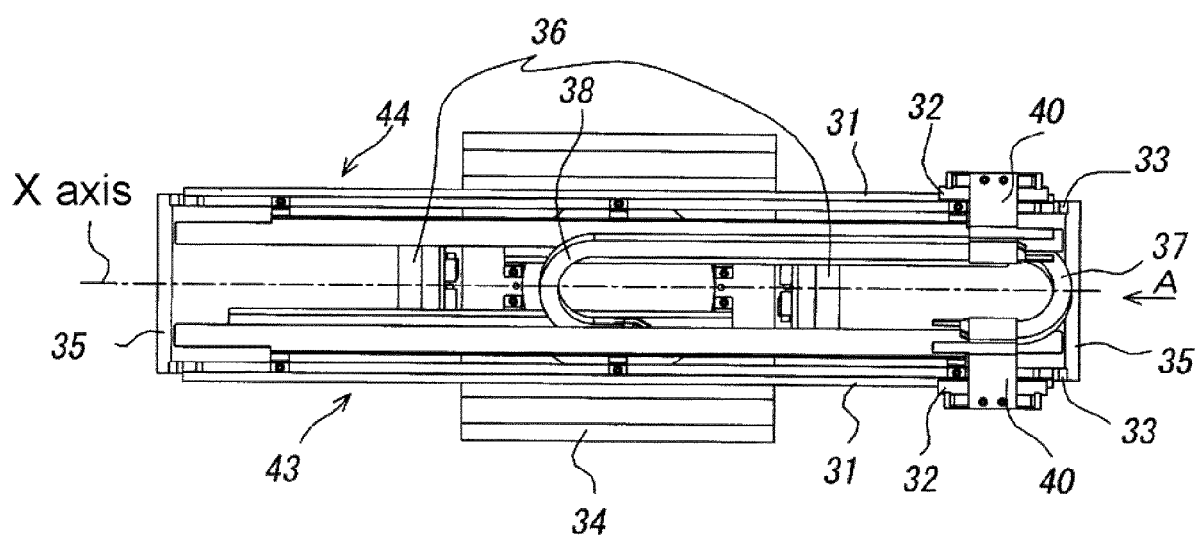
FIG. 3 is a plan view showing an inside of the linear axis driving portion of the first embodiment of the present invention.
Figure 4:
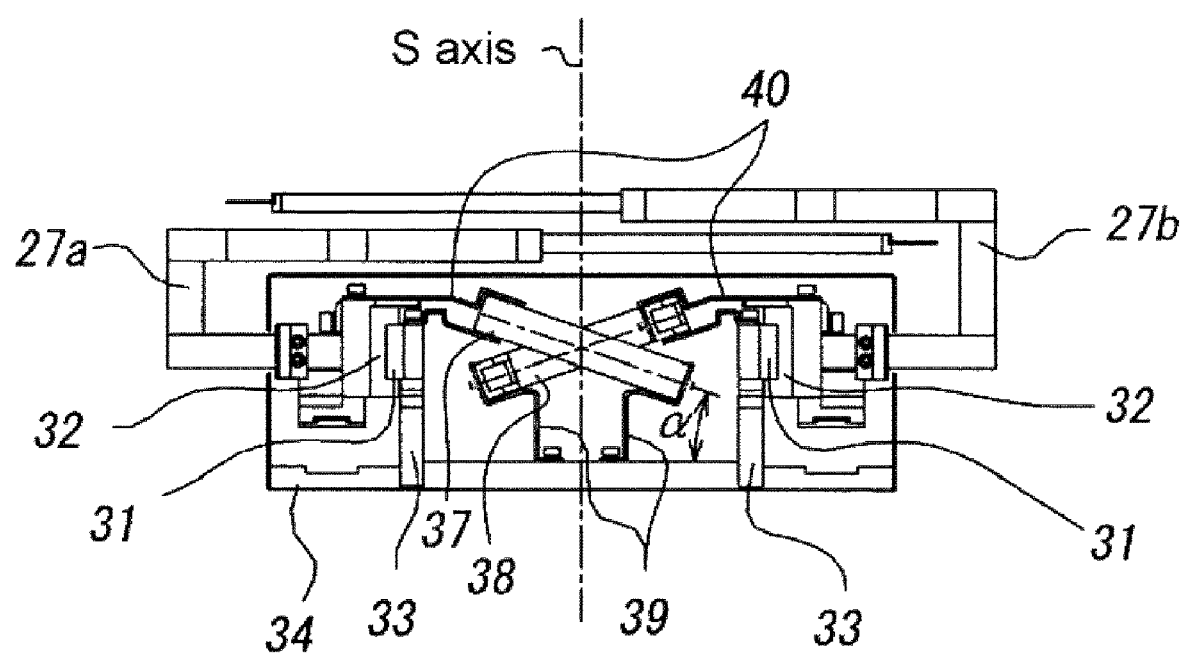
FIG. 4 is a schematic side view showing an inside of the linear axis driving portion of the first embodiment of the present invention.

FIG. 1 is a perspective view showing an inside of the linear axis driving portion 24, which is a perspective view as seen from the same direction in FIG. 2. FIG. 3 is a schematic plan view (top view) showing an inside of the linear axis driving portion 24. In FIGS. 1 and 3, the first and second hands 27a and 27b and the wafers 28 are not illustrated for the convenience of the following explanation. FIG. 4 is a side view showing an inside of the linear axis driving portion 24 as seen from the arrow A in FIG. 3.

In these figures, a table 34 is rotatably mounted on the manipulator supporting portion 25 centering around the S-axis. Two linear guide mounting plates 33 and 33 are arranged perpendicular to the table 34. These linear guide mounting plates 33 are arranged in parallel with each other at a distance, and both ends thereof are connected to side frames 35 and 35 to secure the rigidity of the linear guide mounting plates 33. On the outer vertical surface of each linear guide mounting plate 33, a linear guide 31 is fixed. Each linear guide 31 is fixed so as to extend along the X-axis. Linear guide movable portions 32 and 32 are slidably mounted on the respective linear guides 31. Connected to the linear guide movable portions 32 and 32 are the first and second hands 27a and 27b. Each hand 27a (27b) is moved forward and backward by a motor 36 and a belt (not shown) while being precisely guided by the linear guide 31 along the X-axis. Thus, the linear axis driving portion 24 has a total of two linear axes, or the first linear axis 43 and the second linear axis 44, which drive the first and second hands 27a and 27b along the X-axis, respectively.

As shown in FIG. 4, two cable guide fixed side members 39 and 39 are fixed to the upper surface of the table 34 between the two linear axes 43 and 44. One end of the first cable guide 37 is fixed to one of the cable guide fixed side members 39 and 39, and one end of the second cable guide 38 is fixed to the other cable guide fixed side members 39. The first and second cable guides 37 and 38 are arranged along the X-axis and each curved into a U-shape. The other end of the respective first and second cable guides 37 and 38 is fixed to a cable guide movable side support post 40. Within the respective first and second cable guides 37 and 38, various cables (not shown), such as, e.g., electric cables for supplying electric power, tubes for various fluid including, e.g., air or cooling water, and grounding wires, are accommodated. These cables enables electric power supply or air supply to the hand 27a or 27b for holding a wafer 28.

Also as shown in FIG. 4, the first and second cable guides 37 and 38 are arranged symmetrically to a vertical axis (S-axis in this embodiment) passing the middle portion between the two linear axes 43 and 44 in a crossed manner so that the first and second cable guides 37 and 38 do not interfere with each other during the operation of the linear axes. In detail, the first and second cable guides 37 and 38 are arranged so that the curved inner sides of the U-shaped portions face each other. In this embodiment, in order to reduce the height of the device, as shown in FIG. 4, the inclination angle "α" of the cable guide 37 and 38 with respect to the horizontal plane is set to be moderate. On the other hand, if it is required to reduce the width of the device, the inclination angle "α" is increased. Needless to say, the length of each cable guide 37(38) is set so that the inner opposed portions of the U-shaped first and second cable guides 37 and 38 are not brought into contact with each other even when the first hand 27a and the second hand 27b have reached the front and rear ends of the linear axis (X-axis).

With this structure, the first and second cable guides 37 and 38 can be moved without causing interference with each other even if the first and second hands 27a and 27b are independently moved forward and rearward. Furthermore, the structure can also prevent enlargement of the height size and the planner size of the linear axis driving portion 24 due to the cable handling, resulting in a compact device. Furthermore, the structure allows smooth introduction of wires and/or air tubes arranged along the S-axis via the manipulator supporting portion 25 to the first and second hands 27a and 27b.

As will be apparent from the above explanation, this embodiment of the present invention is especially effective to downsize a manipulator equipped with fore-and-aft driving portion (linear axis) in a wafer transfer manipulator which is required to reduce the installation space or footprint.

Figure 5:
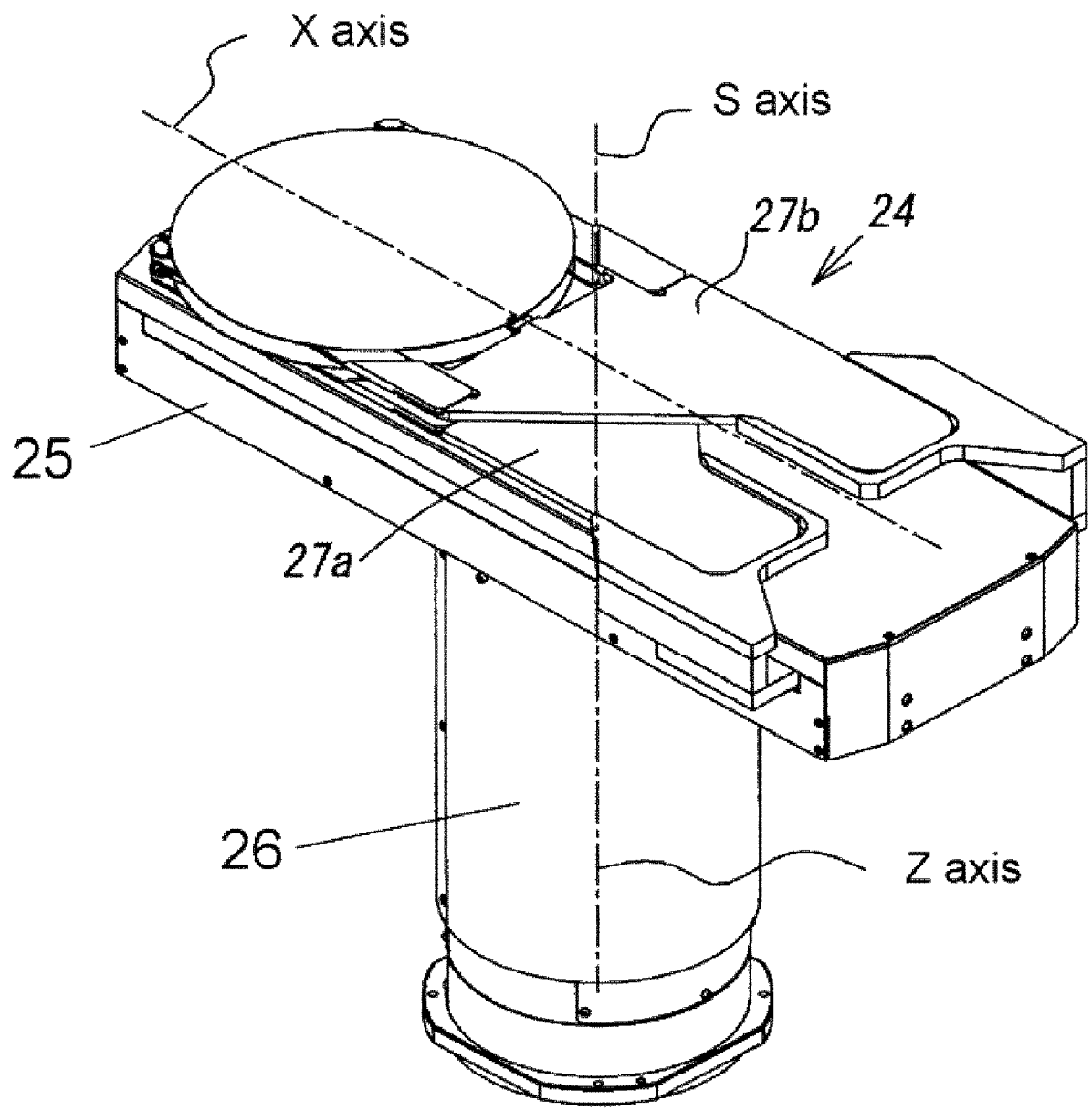
FIG. 5 is an entire perspective view of a manipulator according to a second embodiment of the present invention.

In this first embodiment, wires and/or air tubes are introduced into the linear axis driving portion 24 via the manipulator supporting portion 25. As shown in FIG. 5 of Patent Document 1, however, wires and/or air tubes can be introduced into the linear axis driving portion 24 directly from an outside. Furthermore, in this first embodiment, each of the cable guide fixed side members 39 is fixed to the table 34. However, the member can be fixed to the linear guide mounting plate 33.

Furthermore, in cases where wires and/or air tubes themselves have certain degree of rigidity and can maintain their U-shapes without being accommodated in cable guides, the wires and/or air tubes are not required to be accommodated in the cable guides 37 and 38, and can be arranged like the cable guides as shown in this embodiment.

Figure 9:
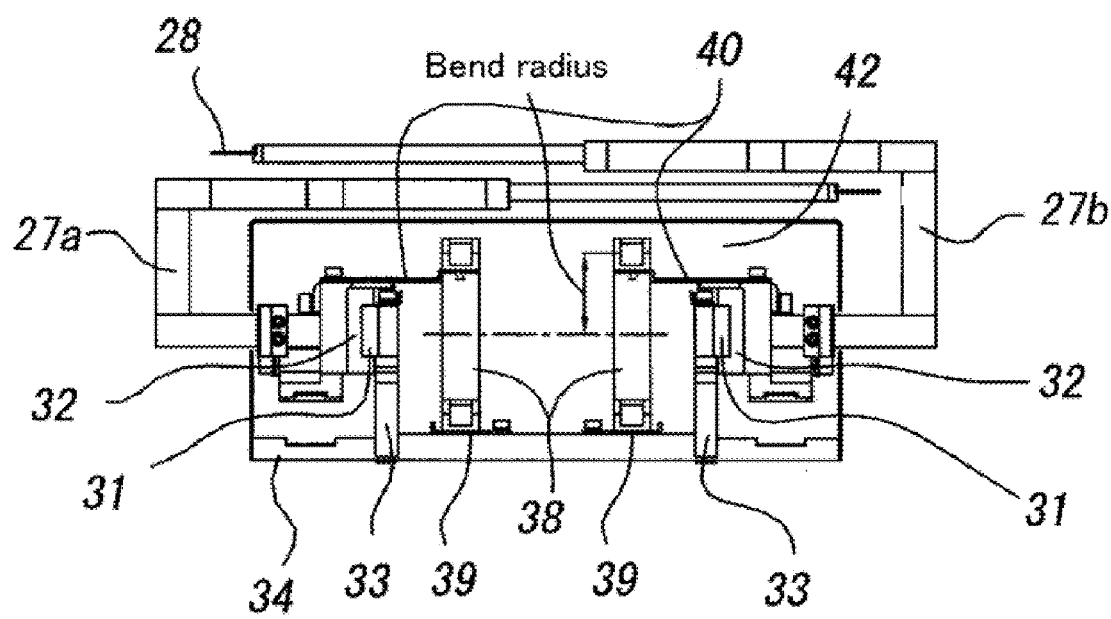
FIG. 9 is a schematic side view showing an inside of a conventional linear axis driving portion.
Figure 10:
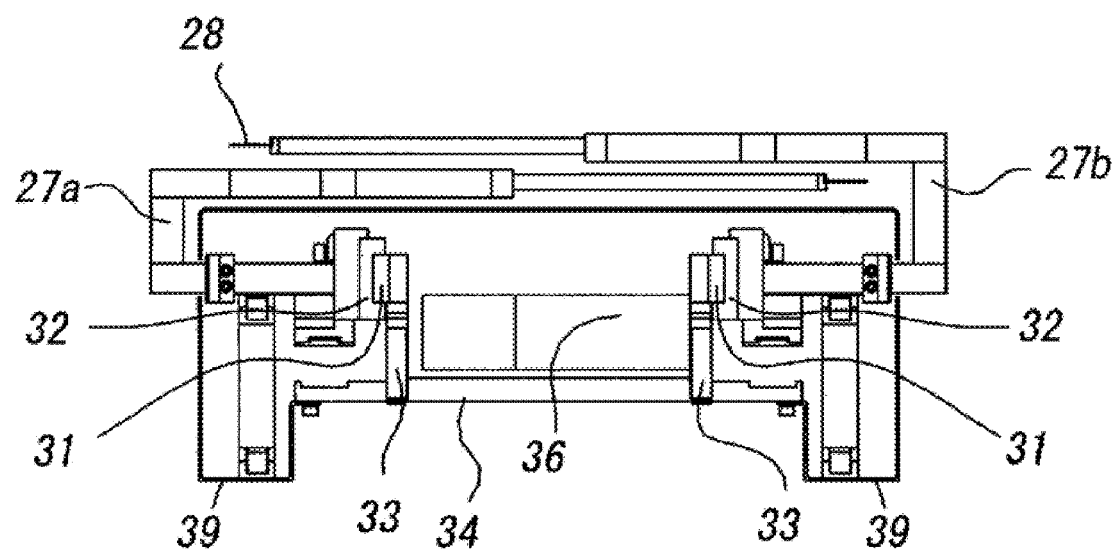
FIG. 10 is a schematic side view showing an inside of another conventional linear axis driving portion.

Furthermore, in the first embodiment, the first and second cable guides 37 and 38 are arranged in a crossed manner as seen from the sliding direction (the direction of the X-axis) of the linear axis. For example, however, in cases where the second cable guide 38 and cables to be accommodated therein are not required, by simply arranging only the first cable guide 37 in an inclined state in the same manner as in this embodiment, the height size or the widthwise size of the device can be reduced as compared with a conventional devices as shown in FIGS. 9 and 10.

In the linear axis of the aforementioned embodiment, the movable portion such as the first hand 27a and the second hand 27b is configured to move in the horizontal direction. The present invention, however, can be applied to a linear axis in which the movable portion is configured to move in a vertical direction or in an inclined direction.

Second Embodiment

FIG. 5 shows a second embodiment of a manipulator for transferring wafers.

In the aforementioned first embodiment explained with reference to FIG. 2, the manipulator 21 include the manipulator lifting and lowering driving portion 26 formed like a supporting column, the manipulator supporting portion 25 to be lifted and lowered at the side surface of the driving portion 26, and the linear axis driving portion 24 rotatably supported by the manipulator supporting portion 25, and the manipulator lifting and lowering driving portion 26 and the linear axis driving portion 24 are positioned on different planes. To the contrary, in this embodiment shown in FIG. 5, immediately below the linear axis driving portion 24, a manipulator supporting portion 25 and the manipulator lifting and lowering driving portion 26 are arranged.

The remaining structure of this embodiment is the same as in the first embodiment, and therefore the cumulative explanation will be omitted.

Third Embodiment

Figure 6:
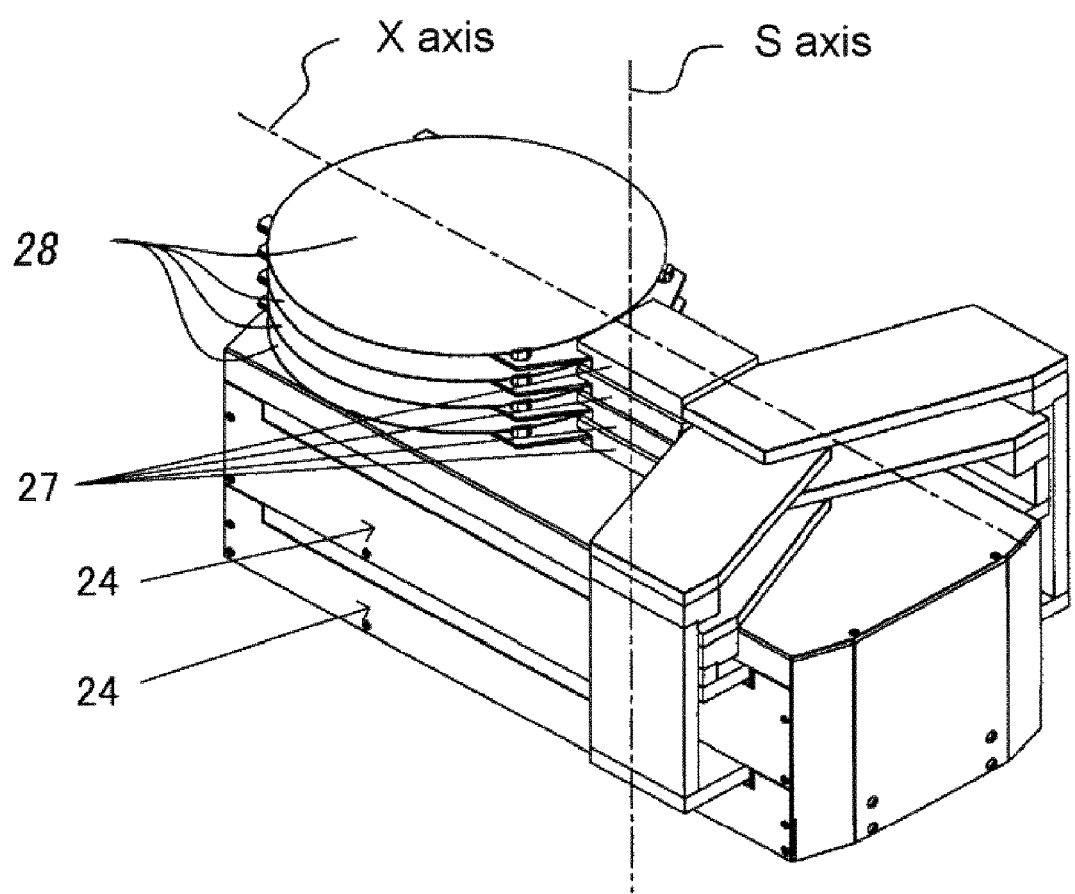
FIG. 6 is a perspective view of a linear axis driving portion with four hands according to a third embodiment of the present invention.
Figure 7:
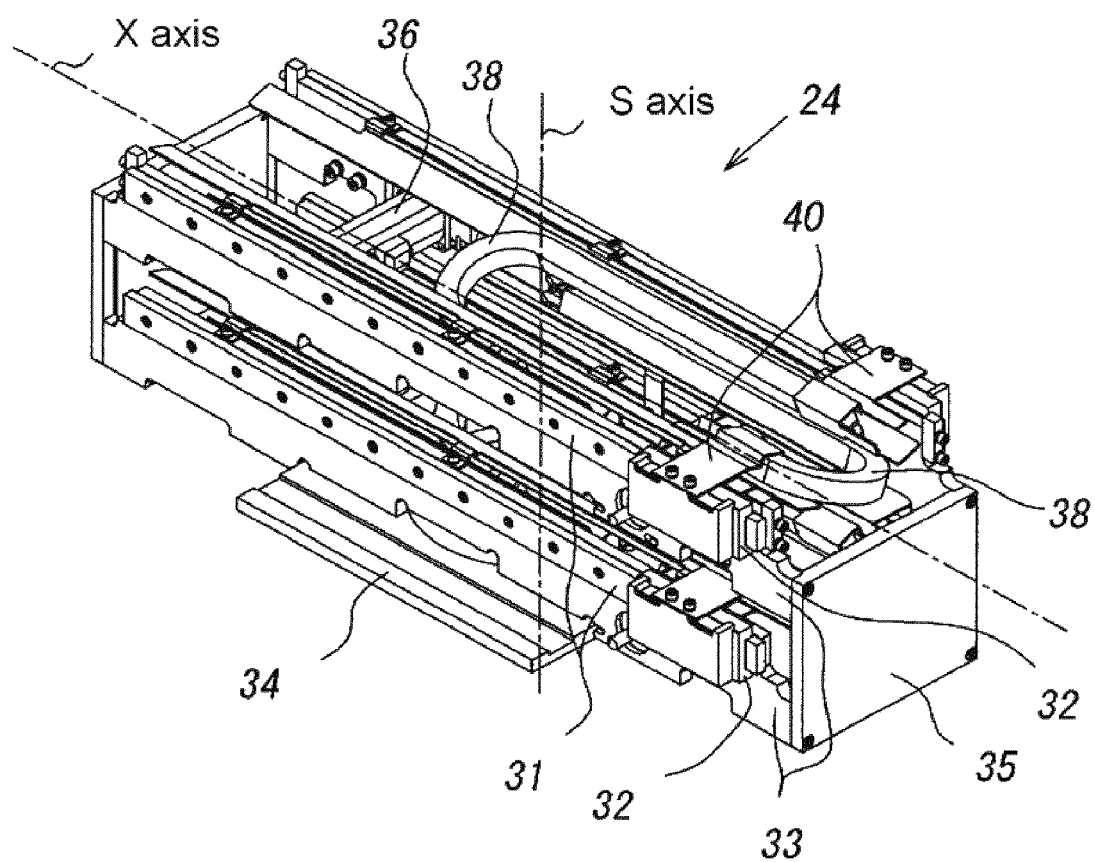
FIG. 7 is a perspective view showing an inside of the linear axis driving portion with four hands according to the third embodiment of the present invention.
Figure 8:
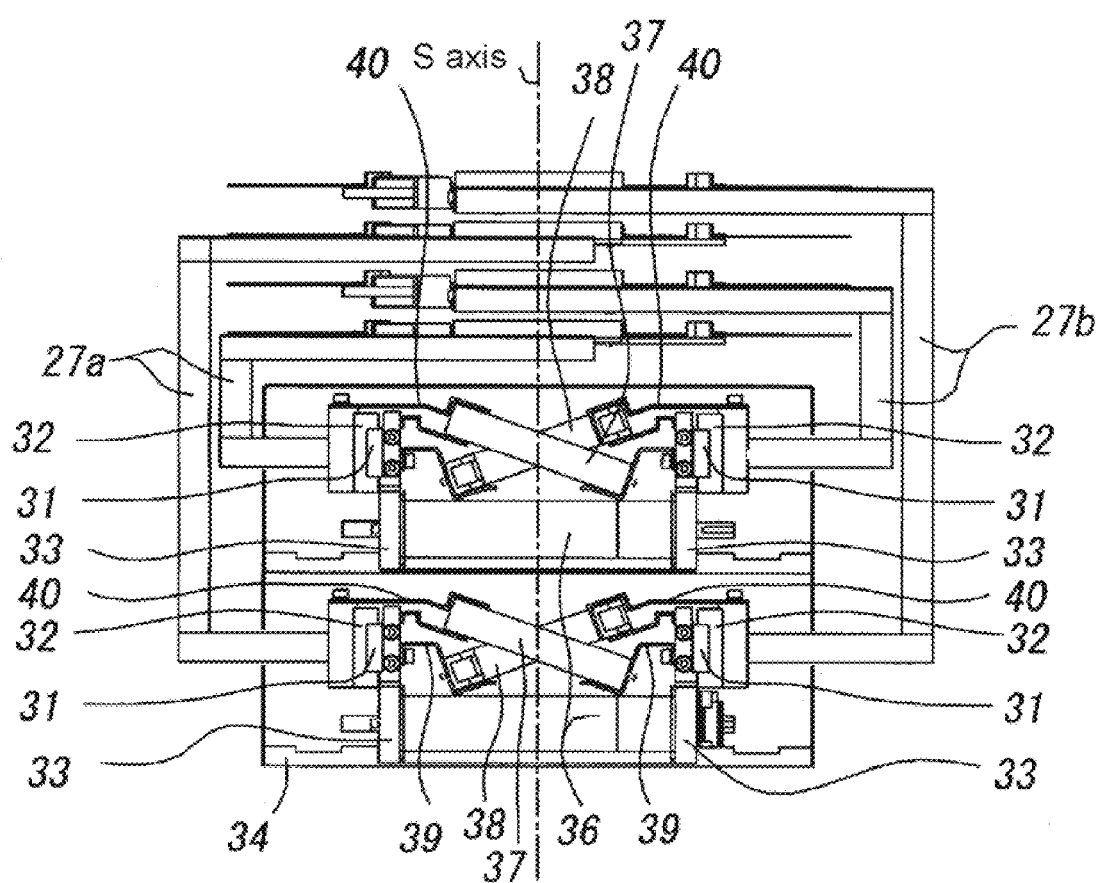
FIG. 8 is a schematic side view showing an inside of the linear axis driving portion with four hands according to the third embodiment of the present invention.

FIGS. 6 to 8 show a third embodiment according to the present invention in which the device has four hands 27.

In the linear axis driving portion 24 of the aforementioned first embodiment, as shown in FIG. 4, each of the first and second hands 27a and 27b extends from the corresponding linear guide movable portion 32 horizontally outward, then extends vertically upward, and then extends toward the inside of the device. Furthermore, as explained above, the first and second cable guides 37 and 38 are arranged symmetrically to a vertical axis (S-axis) passing the middle portion between the two linear axes 43 and 44 in a crossed manner so that the first and second cable guides 37 and 38 do not interfere with each other during the operation of the linear axes. Therefore, the linear axis driving portions can easily be arranged one on the other in a multistage manner.

In this third embodiment, the aforementioned two linear axis driving portions 24 are stacked in a two-tiered manner and both ends of the four linear guide mounting plates 33 are connected to side frames 35 to secure the rigidity of the linear guide mounting plates 33.

With this structure, even if four hands 27 are moved independently forward and rearward, the first and second cable guides 37 and 38 can be operated without causing interference with each other. Furthermore, the structure can also prevent enlargement of the height size and the planner size of the linear axis driving portion 24 due to the cable handling, resulting in a compact device. In addition, the structure allows smooth introduction of wires and/or air tubes arranged along the S-axis to the respective hands 27a and 27b.

In this third embodiment, the explanation was directed the case in which the device has four hands 27. However, even in cases where the device has three, or five or more hands, the same effects can be obtained by vertically stacking the linear axis driving portions in a multistage manner.

The remaining structure of this embodiment is the same as in the first embodiment, and therefore the cumulative explanation will be omitted.

INDUSTRIAL APPLICABILITY

The present invention can be preferably applied to a substrate transfer manipulator as explained above. However, it should be noted that the present invention can also be applied to a transfer device equipped with two or more linear axes disposed in parallel with each other in which power cables and/or air piping to hands having a structure for holding or detecting an article to be transferred are handled.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, the terminology "present invention" or "invention" may be used as a reference to one or more aspects within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A cable handling structure for a linear axis, the cable handling structure comprising:
    a base member including a linear guide, a linear guide mounting plate and a table;
    a movable slide member capable of linearly sliding in parallel with the base member; and
    a cable guide arranged so as to connect the base member and the movable slide member and configured to guide a cable extended from the base member to the movable slide member with the cable accommodated in the cable guide,
    wherein the cable guide is curved into a U-shape with one end thereof fixed to the base member and the other end thereof fixed to the movable slide member, and disposed so as to extend in a moving direction of the movable slide member and incline with respect to the base member as seen from the moving direction of the movable slide member.

2. The cable handling structure as recited in claim 1,
    wherein the movable slide member comprises first and second slide members capable of linearly sliding with respect to the base member and independently moving in parallel with each other,
    wherein the cable guide comprises a first cable guide arranged so as to connect the base member and the first slide member and configured to guide a first cable extended from the base member to the first slide member, and a second cable guide arranged so as to connect the base member and the second slide member and configured to guide a second cable extended from the base member to the second slide member, and
    wherein the first cable guide and the second cable guide are arranged so that inner sides of curved portions of the first and second cable guides face each other and the curved portions cross as seen from the moving direction of the movable slide member.

3. A cable handling structure for a linear axis, the cable handling structure comprising:
    a base member including a linear guide, a linear guide mounting plate and a table;
    a movable slide member capable of linearly sliding with respect to the base member; and
    a cable arranged so as to extend from the base member to the movable slide member,
    wherein the cable is curved into a U-shape with one end thereof fixed to the base member and the other end thereof fixed to the movable slide member, and disposed so as to extend in a moving direction of the movable slide member and incline with respect to the base member as seen from the moving direction of the movable slide member.

4. The cable handling structure as recited in claim 3,
    wherein the movable slide member comprises first and second slide members capable of linearly sliding with respect to the base member and independently moving in parallel with each other,
    wherein the cable comprises a first cable arranged so as to extend from the base member to the first slide member, and a second cable arranged so as to extend from the base member to the second slide member,
    wherein the first cable is curved into a U-shape with one end thereof fixed to the base member and the other end thereof fixed to the first slide member,
    wherein the second cable is curved into a U-shape with one end thereof fixed to the base member and the other end thereof fixed to the second slide member, and
    wherein the first cable and the second cable are arranged so that inner sides of curved portions of the first and second cables face each other and cross as seen from the moving direction of the slide members.

5. A substrate transfer device, comprising:
    a hand for holding a substrate, and
    a cable handling structure for a linear axis, the cable handling structure including
        a base member including a linear guide, a linear guide mounting plate and a table;
        a movable slide member capable of linearly sliding in parallel with the base member; and
        a cable guide arranged so as to connect the base member and the movable slide member and configured to guide a cable extended from the base member to the movable slide member with the cable accommodated in the cable guide,
    wherein the cable guide is curved into a U-shape with one end thereof fixed to the base member and the other end thereof fixed to the movable slide member, and disposed so as to extend in a moving direction of the movable slide member and incline with respect to the base member as seen from the moving direction of the movable slide member.

6. The substrate transfer device as recited in claim 5,
wherein the movable slide member comprises first and second slide members capable of linearly sliding with respect to the base member and independently moving in parallel with each other,
wherein the cable guide comprises a first cable guide arranged so as to connect the base member and the first slide member and configured to guide a first cable extended from the base member to the first slide member, and a second cable guide arranged so as to connect the base member and the second slide member and configured to guide a second cable extended from the base member to the second slide member, and
wherein the first cable guide and the second cable guide are arranged so that inner sides of curved portions of the first and second cable guides face with each other and cross as seen from the moving direction of the movable slide member.

7. A substrate transfer device, comprising:
a hand for holding a substrate, and
a cable handling structure for a linear axis, the cable handling structure including
  a base member including a linear guide, a linear guide mounting plate and a table;
  a movable slide member capable of linearly sliding with respect to the base member; and
  a cable arranged so as to extend from the base member to the movable slide member,
wherein the cable is curved into a U-shape with one end thereof fixed to the base member and the other end thereof fixed to the movable slide member, and disposed so as to extend in a moving direction of the movable slide member and incline with respect to the base member as seen from the moving direction of the movable slide member.

8. The substrate transfer device as recited in claim 7,
wherein the movable slide member comprises first and second slide members capable of linearly sliding with respect to the base member and independently moving in parallel with each other,
wherein the cable comprises a first cable arranged so as to extend from the base member to the first slide member, and a second cable arranged so as to extend from the base member to the second slide member,
wherein the first cable is curved into a U-shape with one end thereof fixed to the base member and the other end thereof fixed to the first slide member,
wherein the second cable is curved into a U-shape with one end thereof fixed to the base member and the other end thereof fixed to the second slide member, and
wherein the first cable and the second cable are arranged so that inner sides of curved portions of the first and second cables face each other and cross as seen from the moving direction of the movable slide member.

9. A substrate transfer device, comprising:
a cable handling structure for a linear axis, the cable handling structure including
  a base member disposed horizontally and including a linear guide, a linear guide mounting plate and a table;
  first and second hands each capable of mounting a substrate, the first and second hands being capable of linearly sliding in parallel with the base member and independently moving in parallel with each other;
  a first cable guide arranged so as to connect the base member and the first hand and configured to guide a first cable extended from the base member to the first slide member; and
  a second cable guide arranged so as to connect the base member and the second hand and configured to guide a second cable extended from the base member to the second slide member,
wherein the first and second cable guides each are curved into a U-shape with one ends of the first and second cable guides fixed to the base member and the other ends of the first and second cable guides fixed to the respective first and second hands, and disposed so that the first and second cable guides extend in a moving direction of the first and second hands with inner sides of curved portions of the first and second cable guides facing each other and the curved portions cross as seen from the moving direction of the first and second hands, and
wherein the first and second hands each are extended in parallel to a horizontal plane of the base member, then extended in a vertical direction, and then extended in a horizontal direction so that the first and second hands overlap up and down.

10. A substrate transfer system, comprising:
a plurality of substrate transfer devices are stacked in a vertical direction, each of said plurality of substrate transfer devices having a cable handling structure for a linear axis which includes
  a base member disposed horizontally and including a linear guide, a linear guide mounting plate and a table;
  first and second hands each capable of mounting a substrate, the first and second hands being capable of linearly sliding in parallel with the base member and independently moving in parallel with each other;
  a first cable guide arranged so as to connect the base member and the first hand and configured to guide a first cable extended from the base member to the first slide member; and
  a second cable guide arranged so as to connect the base member and the second hand and configured to guide a second cable extended from the base member to the second slide member,
wherein the first and second cable guides each are curved into a U-shape with one ends of the first and second cable guides fixed to the base member and the other ends of the first and second cable guides fixed to the respective first and second hands, and disposed so that the first and second cable guides extend in a moving direction of the first and second hands with inner sides of curved portions of the first and second cable guides facing each other and the curved portions cross as seen from the moving direction of the first and second hands, and
wherein the first and second hands each are extended in parallel to a horizontal plane of the base member, then extended in a vertical direction, and then extended in a horizontal direction so that the first and second hands overlap up and down.

\* \* \* \* \*